US009753370B2

(12) United States Patent
Hong et al.

(10) Patent No.: US 9,753,370 B2
(45) Date of Patent: Sep. 5, 2017

(54) MULTIPLE-PATTERN FORMING METHODS

(71) Applicants: Rohm and Haas Electronic Materials LLC, Marlborough, MA (US); Dow Global Technologies LLC, Midland, MI (US); Rohm and Haas Electronic Materials Korea Ltd., Cheonan (KR)

(72) Inventors: Chang-Young Hong, Cheongwon-gun (KR); Cheng-Bai Xu, Southborough, MA (US); Jung Woo Kim, Kyunggido (KR); Cong Liu, Shrewsbury, MA (US); Shintaro Yamada, Shrewsbury, MA (US); Lori Anne Joesten, Charlton, MA (US); Choong-Bong Lee, Westborough, MA (US); Phillip D. Hustad, Natick, MA (US); James C. Taylor, Grafton, MA (US)

(73) Assignees: Dow Global Technologies LLC, Midland, MI (US); Rohm and Haas Electronic Materials LLC, Marlborough, MA (US); Rohm and Haas Electronic Materials Korea Ltd. (KR)

( * ) Notice: Subject to any disclaimer, the term of this patent is extended or adjusted under 35 U.S.C. 154(b) by 78 days.

(21) Appl. No.: 14/836,050

(22) Filed: Aug. 26, 2015

(65) Prior Publication Data
US 2016/0062232 A1 Mar. 3, 2016

Related U.S. Application Data

(60) Provisional application No. 62/042,786, filed on Aug. 27, 2014.

(51) Int. Cl.
*G03F 7/40* (2006.01)
*H01L 21/027* (2006.01)
(Continued)

(52) U.S. Cl.
CPC .............. *G03F 7/40* (2013.01); *G03F 7/0397* (2013.01); *G03F 7/2041* (2013.01); *G03F 7/322* (2013.01);
(Continued)

(58) Field of Classification Search
None
See application file for complete search history.

(56) References Cited

U.S. PATENT DOCUMENTS 8,445,183 B2 5/2013 Miyamoto
2008/0305443 A1* 12/2008 Nakamura .......... H01L 21/0273
430/325
(Continued)

FOREIGN PATENT DOCUMENTS

JP 2009053547 A 3/2009
JP 2011238795 A 11/2011
(Continued)

OTHER PUBLICATIONS

Tarutani, et al, "Development of materials and processes for double patterning toward 32-nm node 193-nm immersion lithography process", Proc. of SPIE, Advances in Resist Materials and Processing Technology XXV, 2008, vol. 6923, pp. 69230F.
(Continued)

*Primary Examiner* — Kathleen Duda
(74) *Attorney, Agent, or Firm* — Jonathan D. Baskin

(57) ABSTRACT

Multiple-pattern forming methods are provided. The methods comprise: (a) providing a semiconductor substrate comprising one or more layers to be patterned; (b) forming a photoresist layer over the one or more layers to be patterned, wherein the photoresist layer is formed from a composition comprising: a matrix polymer comprising an acid labile group; a photoacid generator; and a solvent; (c) patternwise exposing the photoresist layer to activating radiation; (d)
(Continued)

baking the exposed photoresist layer; (e) contacting the baked photoresist layer with a first developer to form a first resist pattern; (f) treating the first resist pattern with a coating composition comprising an expedient for switching solubility of a sidewall region of the first resist pattern from soluble to insoluble with respect to a second developer that is different from the first developer; and (g) contacting the treated first resist pattern with the second developer to remove portions of the first resist pattern, leaving the solubility-switched sidewall region to form a multiple-pattern. The methods have particular applicability to the semiconductor manufacturing industry for the formation of fine lithographic patterns.

13 Claims, 3 Drawing Sheets

(51) Int. Cl.
G03F 7/32 (2006.01)
G03F 7/039 (2006.01)
G03F 7/20 (2006.01)
H01L 21/033 (2006.01)

(52) U.S. Cl.
CPC .............. *G03F 7/325* (2013.01); *G03F 7/405* (2013.01); *H01L 21/0273* (2013.01); *H01L 21/0337* (2013.01)

(56) References Cited

U.S. PATENT DOCUMENTS

| | | |
|---|---|---|
| 2010/0040971 A1 | 2/2010 | Tarutani et al. |
| 2010/0055624 A1 | 3/2010 | Gronheid et al. |
| 2010/0119717 A1 | 5/2010 | Hong et al. |
| 2010/0183851 A1 | 7/2010 | Cao et al. |
| 2012/0064456 A1 | 3/2012 | Bae et al. |
| 2013/0171574 A1 | 7/2013 | Xu |
| 2013/0171825 A1 | 7/2013 | Xu |

FOREIGN PATENT DOCUMENTS

| | | |
|---|---|---|
| JP | 2015127796 A | 7/2015 |
| JP | 2015132811 A | 7/2015 |
| TW | 201520693 A | 6/2015 |
| WO | 2008004735 A1 | 1/2008 |

OTHER PUBLICATIONS

Search report for corresponding Taiwan Application No. 104127128 dated Sep. 8, 2016.
Search report for corresponding China Application No. 201510536341.5 dated Feb. 10, 2017.

* cited by examiner

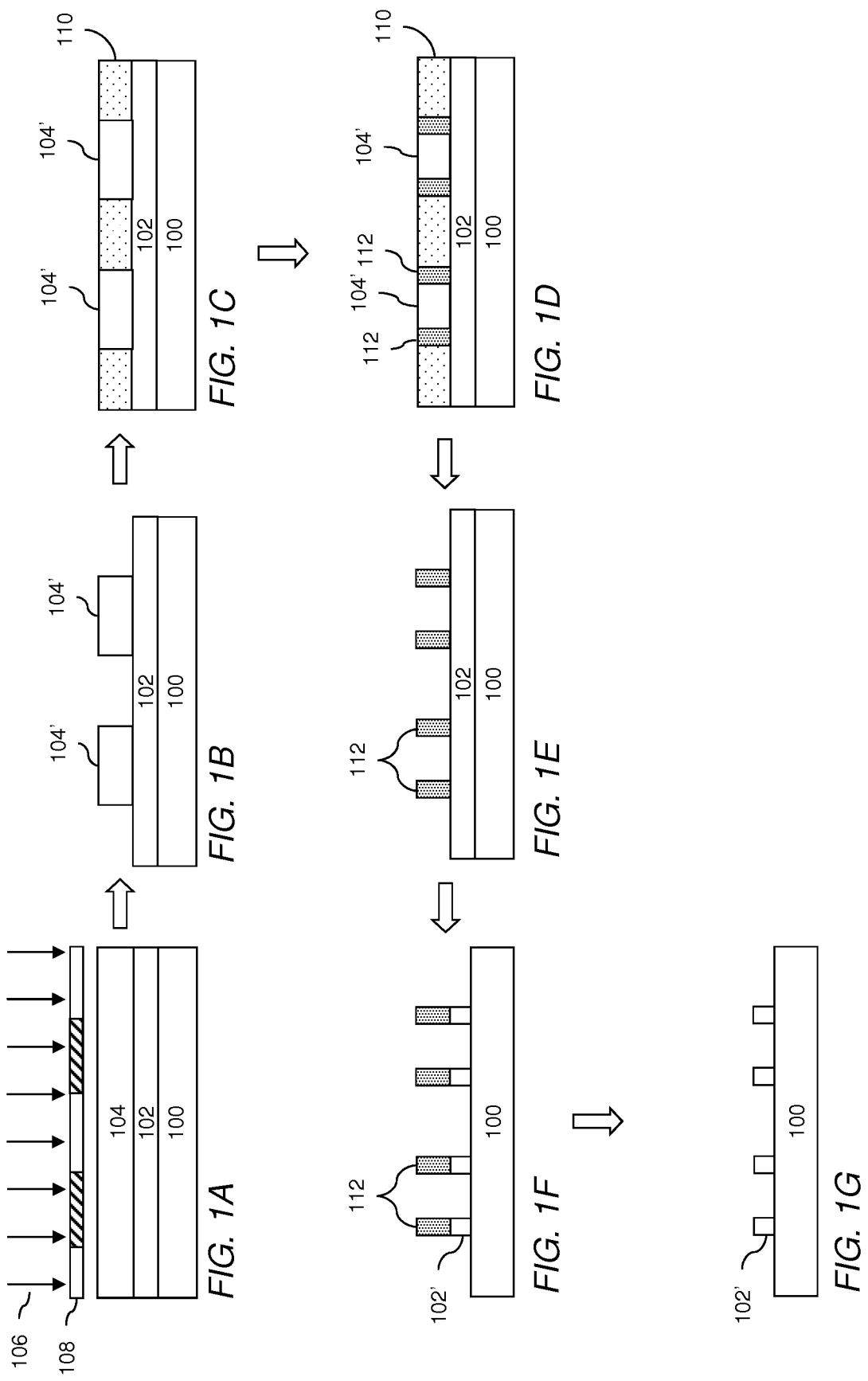

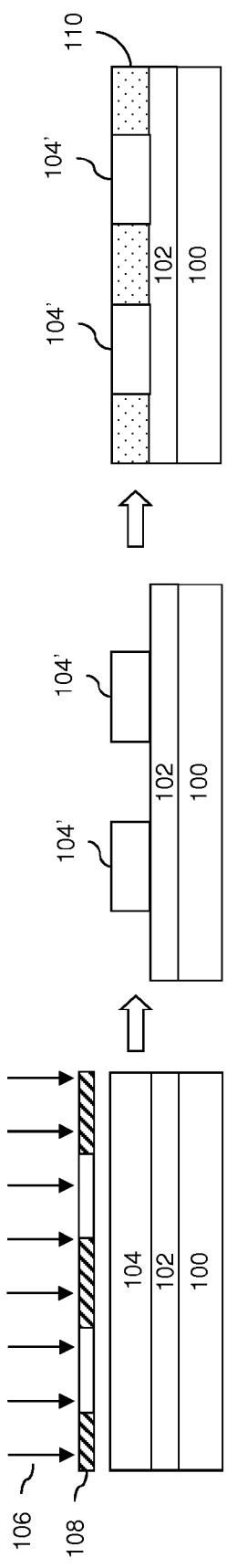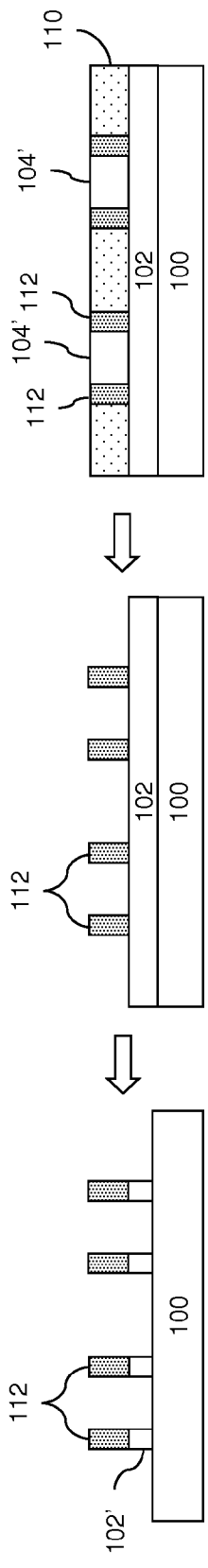

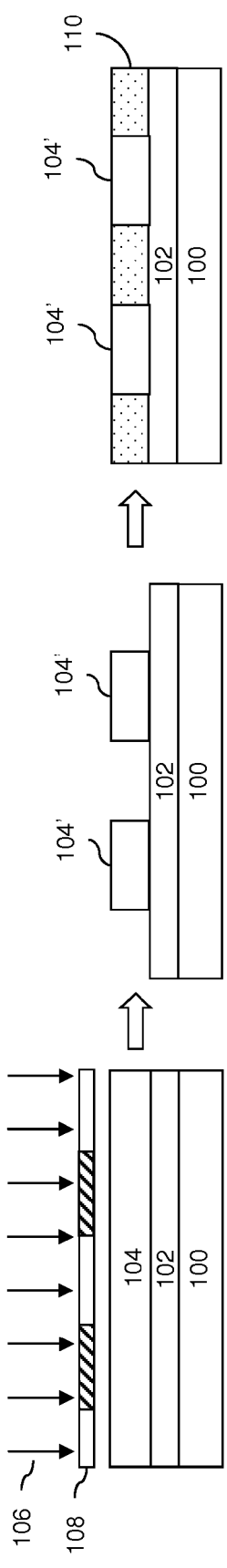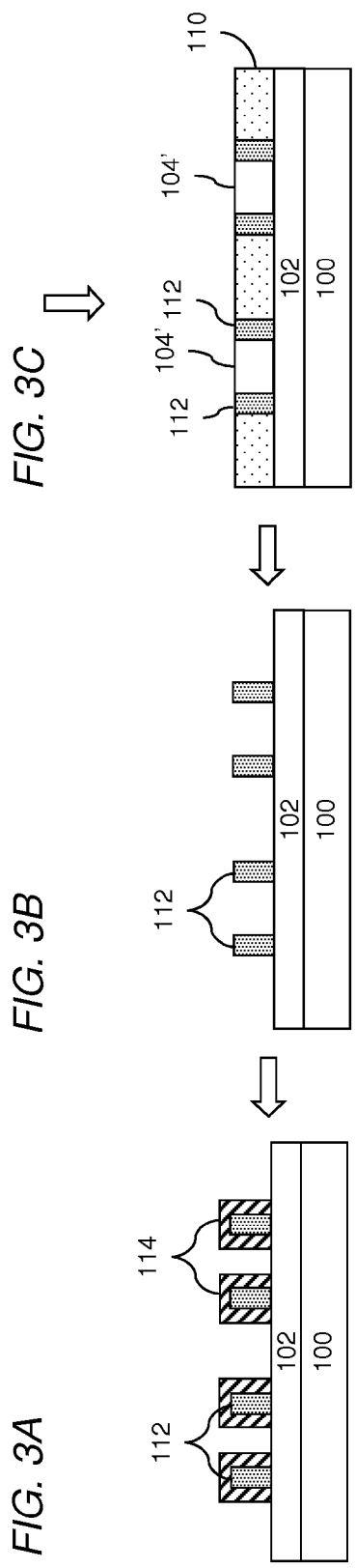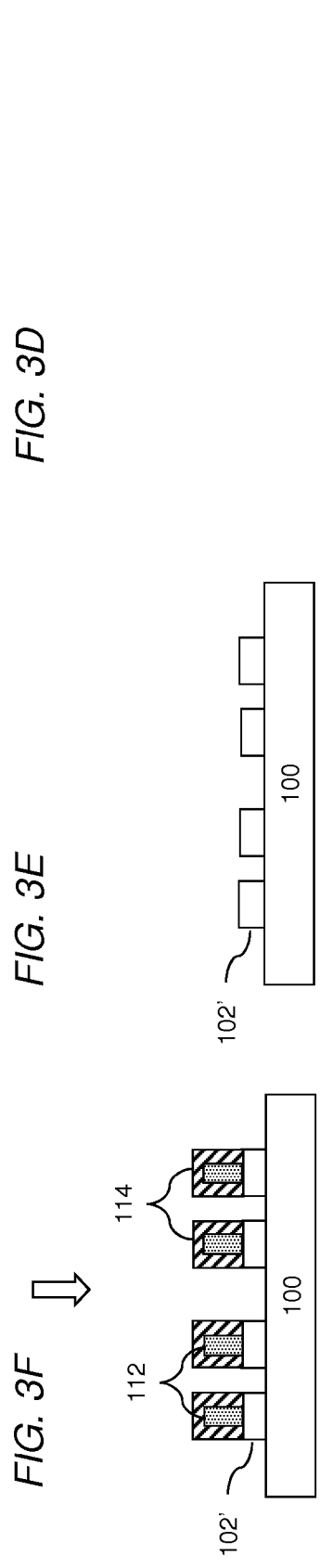

MULTIPLE-PATTERN FORMING METHODS

This application claims the benefit of priority under 35 U.S.C. §119(e) to U.S. Provisional Application No. 62/042,786, filed Aug. 27, 2014, the entire contents of which are incorporated herein by reference.

BACKGROUND

The invention relates generally to the manufacture of electronic devices. More specifically, this invention relates to multiple pattern forming methods for the formation of fine lithographic patterns.

In the semiconductor manufacturing industry, photoresist materials are used for transferring an image to one or more underlying layers, such as metal, semiconductor or dielectric layers, disposed on a semiconductor substrate, as well as to the substrate itself. To increase the integration density of semiconductor devices and allow for the formation of structures having dimensions in the nanometer range, photoresists and photolithography processing tools having high resolution capabilities have been and continue to be developed.

One approach to achieving nm-scale feature sizes in semiconductor devices is the use of short wavelengths of light, for example, 193 nm or less, during exposure of chemically amplified photoresists. Immersion lithography effectively increases the numerical aperture of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium.

For the printing of line and space patterns, 193 nm immersion scanners are typically capable of resolving 36 nm half-pitch line and space patterns. The resolution for printing contact holes or arbitrary 2D patterns is further limited due to the low aerial image contrast with a dark field mask. The smallest half-pitch of contact holes for immersion lithography is generally limited to about 50 nm. The standard immersion lithography process is generally not suitable for manufacture of devices requiring greater resolution.

In an effort to achieve greater resolution and to extend capabilities of existing lithography tools, various double patterning techniques have been proposed. One such technique is self-aligned double patterning (SADP) (see, e.g., US 2009/0146322A1). In the conventional SADP process, a spacer layer is formed over pre-patterned lines, followed by etching to remove all spacer layer material on horizontal surfaces of the lines and spaces, leaving behind only material on the sidewalls of the lines. The original patterned lines are then etched away, leaving behind the sidewall spacers which are used as a mask for etching one or more underlying layers. Since there are two spacers for every line, the line density is effectively doubled. Conventional SADP processes require the use of complicated deposition and etching equipment and processing schemes, and can result in poor throughput and increased probability of wafer contamination. It would be desirable to employ a simpler double patterning approach which avoids or minimizes such problems.

Another double patterning technique is the double development method described, for example, in the document "*Exploration of New Resist Chemistries and Process Methods for Enabling Dual-Tone Development,*" C. Fonseca et al, 6$^{th}$ International Symposium on Immersion Lithography Extensions, Prague, Czech Republic (Oct. 22, 2009). This technique doubles the number of features formed from a photoresist layer by developing the photoresist layer twice, first by a positive tone developer (e.g., TMAH) to remove the high exposure dose areas and then by a negative tone developer (organic solvent) to remove the unexposed or lowest exposure dose areas. The negative tone developer is intended to remove the center portion of the resist pattern formed after the positive tone development while leaving the intermediate dose areas typically defining two opposing sidewalls of the resist pattern. Problems associated with the basic double development method include poor line width roughness (LWR) and unacceptable pattern shape. These problems are understood to be due to low acid contrast of the pattern sidewalls after the positive tone development.

The C. Fonseca et al document further describes a double development process which includes a step of flood exposure and baking after the positive tone development. This is believed to produce a high acid content in sidewalls of the resist pattern as a result of deprotection of acid-labile groups in the sidewall regions, rendering the sidewall portions insoluble in the negative tone developer. This method, however, can be disadvantageous in that acid-labile groups throughout the resist pattern including the previous low-dose regions can simultaneously become deprotected during the flood exposure and bake. This can render the low dose regions insoluble or partially insoluble in the negative tone developer, making it difficult for the developer to penetrate into and completely remove the center portion of the resist pattern, resulting in pattern defects.

There is a continuing need in the art for multiple-patterning processes useful in electronic device fabrication that address one or more of the foregoing problems associated with the state of the art.

SUMMARY OF THE INVENTION

In accordance with one aspect of the invention, multiple-pattern forming methods are provided. The methods comprise: (a) providing a semiconductor substrate comprising one or more layers to be patterned; (b) forming a photoresist layer over the one or more layers to be patterned, wherein the photoresist layer is formed from a composition comprising: a matrix polymer comprising an acid labile group; a photoacid generator; and a solvent; (c) patternwise exposing the photoresist layer to activating radiation; (d) baking the exposed photoresist layer; (e) contacting the baked photoresist layer with a first developer to form a first resist pattern; (f) treating the first resist pattern with a coating composition comprising an expedient for switching solubility of a sidewall region of the first resist pattern from soluble to insoluble with respect to a second developer that is different from the first developer; and (g) contacting the treated first resist pattern with the second developer to remove portions of the first resist pattern, leaving the solubility-switched sidewall region to form a multiple-pattern.

The methods of the invention find particular applicability in the manufacture of semiconductor devices for providing high resolution patterns. The terminology used herein is for the purpose of describing particular embodiments only and is not intended to be limiting of the invention. As used herein, the singular forms "a", "an" and "the" are intended to include both singular and plural forms, unless the context indicates otherwise.

DESCRIPTION OF THE DRAWINGS

The present invention will be described with reference to the following drawing, in which like reference numerals denote like features, and in which:

FIG. 1A-G illustrates a process flow for forming a photolithographic multiple-pattern by a double development process in accordance with the invention;

FIG. 2A-G illustrates a process flow for forming a photolithographic multiple-pattern by a double development process in accordance with a further aspect of the invention; and FIG. 3A-H illustrates a process flow for forming a photolithographic multiple-pattern by a double development process in accordance with a further aspect of the invention.

DETAILED DESCRIPTION

Processes in accordance with the invention will now be described with reference to FIG. 1, which illustrates an exemplary process flow for forming a multiple-pattern. FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to use a hard mask layer and/or a bottom antireflective coating (BARC) over which a photoresist layer 104 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching underlying layers. Suitable hard mask materials and their formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA).

A photoresist layer 104 is formed from a chemically amplified photosensitive composition. The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 104 is from about 500 to 3000 Å.

Photoresist compositions useful in the invention include chemically-amplified photoresist compositions comprising a matrix resin that is acid-sensitive, meaning that as part of a layer of the photoresist composition, the resin and composition layer undergo a change in solubility in an organic developer as a result of reaction with acid generated by a photoacid generator following softbake, exposure to activating radiation and post exposure bake. The change in solubility is brought about when acid-labile leaving groups such as photoacid-labile ester or acetal groups in the matrix polymer undergo a photoacid-promoted deprotection reaction on exposure to activating radiation and heat treatment to produce an acid. Suitable photoresist compositions useful for the invention are commercially available.

For imaging at sub-200 nm wavelengths such as 193 nm, the matrix polymer is typically substantially free (e.g., less than 15 mole %) or completely free of phenyl, benzyl or other aromatic groups where such groups are highly absorbing of the radiation. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer.

Suitable matrix polymers further include polymers that contain (alkyl)acrylate units, preferably including acid-labile (alkyl)acrylate units, such as t butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Other suitable matrix polymers include, for example, those which contain polymerized units of a non-aromatic cyclic olefin (endocyclic double bond) such as an optionally substituted norbornene.

Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662. Also suitable as the matrix polymer is a resin that contains repeat units that contain a hetero atom, particularly oxygen and/or sulfur (but other than an anhydride, i.e., the unit does not contain a keto ring atom). The heteroalicyclic unit can be fused to the polymer backbone, and can comprise a fused carbon alicyclic unit such as provided by polymerization of a norbornene group and/or an anhydride unit such as provided by polymerization of a maleic anhydride or itaconic anhydride. Such polymers are disclosed in PCT/US01/14914 and U.S. Pat. No. 6,306,554. Other suitable hetero-atom group containing matrix polymers include polymers that contain polymerized carbocyclic aryl units substituted with one or more heteroatom (e.g., oxygen or sulfur) containing groups, for example, hydroxy naphthyl groups, such as disclosed in U.S. Pat. No. 7,244,542.

Blends of two or more of the above-described matrix polymers can suitably be used in the photoresist compositions. Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight Mw of the matrix polymer is typically less than 100,000, for example, from 5000 to 100,000, more typically from 5000 to 15,000.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate; triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, negative-acting resist compositions typically also include a crosslinker component. Suitable crosslinker components include, for example, an amine-based material such as a melamine resin, that will cure, crosslink or harden upon exposure to acid on exposure of a photoacid generator to activating radiation. Preferred crosslinkers include amine-based materials, including melamine, glycolurils, benzoguanamine-based materials and urea-based materials. Melamine-formaldehyde resins are generally most preferred. Such crosslinkers are commercially available, e.g., the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125. For imaging at sub-200 nm wavelengths such as 193 nm, preferred negative-acting photoresists are disclosed in WO 03077029 to the Shipley Company.

The photoresist compositions can also include other optional materials. For example, the compositions can include one or more of actinic and contrast dyes, antistriation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases include, for example: linear and cyclic amides and derivatives thereof such as N,N-bis (2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2'''-(ethane-1,2-diylbis (azanetriyl))tetraethanol, and 2-(dibutylamino)ethanol, 2,2', 2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N(2-acetoxy-ethyl) morpholine. The added base is typically used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition. Suitable photoresists are known in the art and include, for example, those described in US Patent Publications US20100040971A1, US20100055624A1, US20110294069A1, US20120219902A1, US20130115559A1 and U.S, Pat. No. 7,998,655B2.

The photoresist layer 104 is typically next softbaked to minimize solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 85 to 150° C., and a time of from about 30 to 90 seconds.

The photoresist layer 104 is next patternwise-exposed to activating radiation 106 through a photomask 108 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, sub-300 nm or sub-200 nm such as 193 nm or an EUV wavelengths (e.g., 13.4 or 13.5 nm), with 193 nm (immersion or dry lithography) and EUV being preferred. The exposure energy is typically from about 10 to 80 mJ/cm$^2$, dependent upon the exposure tool and the components of the photosensitive composition.

Following exposure of the photoresist layer 104, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed.

The photoresist layer 104 is next developed with a positive tone developer to remove exposed regions of the layer, leaving unexposed regions forming a resist pattern 104' as shown in FIG. 1B. The resist pattern is not limited and can include, for example, line/space patterns and/or contact hole patterns. Suitable positive tone developers include, for example, aqueous alkaline developers such as quaternary ammonium hydroxide solutions, for example, a tetra-alkyl ammonium hydroxide solutions, typically a 0.26 Normality (N) (2.38 wt %) tetramethylammonium hydroxide (TMAH) solution.

As shown in FIG. 1C, the resist pattern 104' formed after positive tone development is treated with a coating composition 110 comprising an expedient for switching solubility of sidewall regions of the pattern from soluble to insoluble with respect to a second developer that is different from the positive tone developer. The expedient for switching solubility is typically an acid or an acid generator, for example, a thermal acid generator or a photoacid generator, or a combination of any of the foregoing. The acid or generated acid in the case of an acid generator can bring about a solubility switch in sidewall portions of the photoresist pattern by causing cleavage of the acid-labile groups of the matrix polymer of the photoresist pattern. In addition to the solubility-switching expedient, the coating composition typically includes a matrix polymer and a solvent, and can include optional additional components. The matrix polymer allows for the coating compositions to be coated over the photoresist pattern in the form of a layer having a desired thickness. This helps to ensure the presence of a sufficient content of acid for interaction with the photoresist pattern.

Suitable acids for use in the coating compositions include inorganic acids and organic acids. Suitable inorganic acids include, for example, nitric acids, halogen acids such as hydrofluoric acids, hydrochloric acids, hydrobromic acids and hydriotic acids, sulfuric acids, sulfurous acids, perchloric acids, boric acids and phosphorus acids such as phosphorus acids and phosphoric acids. Of these inorganic acids, sulfuric acids are preferred. Organic acids include, for example, carboxylic acids and polycarboxylic acids such as alkanoic acids, including formic acid, acetic acid, propionic acid and butyric acid, dichloroacetic acid, trichloroacetic acid, perfluoroacetic acid, perfluorooctanoic acid, dicarboxylic acids, such as oxalic acid, malonic acid and succinic acid, hydroxyalkanoic acids, such as citric acid, organic phosphorus acids such as dimethylphosphoric acid and dimethylphosphinic acid, sulfonic acids such as alkylsulfonic acids including methanesulfonic acid, ethanesulfonic acid, 1-pentanesulfonic acid, 1-hexanesulfonic acid, 1-heptanesulfonic acid, aromatic sulfonic acids such as benzenesulfonic acid, benzenedisulfonic acid, tolulenesulfonic acid, naphthalenesulfonic acid, and the like. Preferable acids for use in the coating compositions include aliphatic and aromatic structures.

Suitable acid generators for use in the coating compositions include those chosen from thermal acid generators (TAGs), photoacid generators (PAGs) and combinations thereof. The TAG generates an acid upon heating of the coating composition to (or exceeding) a temperature characteristic of the particular TAG. The PAG generates an acid upon exposure of the composition to activating radiation for the particular PAG, for example, light having a particular wavelength (e.g., 365 nm, 248 nm, 193 nm or EUV wavelength (e.g., 13.5 nm) or electron beam (E-beam) radiation. Where a PAG is present in the coating composition, care should be taken to use an exposure radiation that will not adversely impact the photoresist pattern. For example, where the underlying photoresist pattern is formed from a positive tone material, the coating composition exposure radiation should be chosen so as not to cause deprotection of the pattern's resist material. Typically, the composition includes a TAG without PAGs, as acid generation by heating can be performed in a simpler manner than by exposure to activating radiation. Preferably, the generated acid from the TAG or PAG is a strong acid such as sulfonic acid, and can be aromatic or non-aromatic. The generated acids are optionally fluorinated. For example, TAGs and PAGs having at least one fluorine substituent at the alpha position of the acid for non-aromatic structures can be used.

Suitable TAGs can be activated at a temperature greater than 50° C., for example, greater than 70° C., greater than 90° C., greater than 120° C. or greater than 150° C.

Examples of suitable thermal acid generators include nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, trifluoromethylbenzenesulfonic acid, perfluorobutane sulfonic acid; and particular onium salts. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Examples of TAGs include those sold by King Industries, Norwalk, Conn. USA under NACURE™, CDX™ and K-PURE™ names, for example, NACURE 5225, CDX-2168E, K-PURE™ 2678 and K-PURE™ 2700. One or more of such TAGs can be used. Suitable photoacid generators are known in the art of chemically amplified photoresists and include, for example, those described above with respect to the photoresist compositions. One or more of such PAGs can be used.

The expedient for switching solubility is typically present in the compositions in an amount of from 0.01 to 20 wt %, more typically from 0.1 to 10 wt % or from 1 to 5 wt %, based on total solids of the coating composition.

The matrix polymer of the coating composition should have good solubility in the second developer to allow for complete removal during development. The matrix polymer of the coating composition typically exhibits a developer dissolution rate of 100 Å/second or higher, preferably 1000 Å/second or higher. The matrix polymer is soluble in the solvent of the coating composition, described herein, as well as the second developer. The matrix polymer can be chosen, for example, from polyvinyl alcohols, polyacrylic acids, polyvinyl pyrrolidones, polyvinyl amines, polyvinyl acetals, polystyrenes, poly(meth)acrylates and combinations thereof. Preferably, the polymer contains one or more functional group chosen from —OH, —COOH, —$SO_3H$, SiOH, hydroxyl styrene, hydroxyl naphthalene, sulfonamide, hexafluoroisopropyl alcohol, anhydrates, lactones, esters, ethers, allylamine, pyrolidones and combinations thereof.

The content of the matrix polymer in the coating composition will depend, for example, on the target thickness of the layer, with a higher polymer content being used for thicker layers. The matrix polymer is typically present in the compositions in an amount of from 80 to 99 wt %, more typically from 90 to 98 wt %, based on total solids of the coating composition. The weight average molecular weight of the polymer is typically less than 400,000, preferably from 3000 to 50,000, more preferably from 3000 to 25,000.

Polymers useful in the coating compositions can be homopolymers or can be copolymers having a plurality of distinct repeat units, for example, two, three or four distinct repeat units. The coating compositions typically include a single polymer, but can optionally include one or more additional polymer. Suitable polymers and monomers for use in the coating compositions are commercially available and/or can be readily made by persons skilled in the art.

The coating compositions further include a solvent or solvent mixture. The coating compositions can take the form of an aqueous solution. Suitable solvent materials to formulate and cast the coating compositions exhibit very good solubility characteristics with respect to the non-solvent components of the coating composition, but do not appreciably dissolve the first photoresist pattern so as to minimize intermixing. The solvent is typically chosen from water, organic solvents and mixtures thereof. Suitable organic solvents for the coating composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; alcohols such as straight, branched or cyclic $C_4$-$C_9$ monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; ethers such as isopentyl ether and dipropylene glycol monomethyl ether; and mixtures containing one or more of these solvents. Of these organic solvents, alcohols, esters, ethers and aliphatic hydrocarbons are preferred. The solvent component of the coating composition is typically present in an amount of from 90 to 99 wt % based on the coating composition.

The coating composition can further include a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the triblock EO-PO-EO co-polymers PLURONIC® 25R2, L121, L123, L31, L81, L101 and P123 (BASF, Inc.).

A surface active additive can advantageously be used in the coating compositions to prevent or minimize the presence of an overburden layer from the CTO which overburden layer could lead to unwanted acid diffusion from the coating composition into the upper surface of the resist pattern. A suitable surface active additive can migrate to the upper surface of a layer formed from the coating composition during treatment of the first pattern. Optionally, a surface active base generator such as a surface active thermal base generator can be used to neutralize acid present in an overburden layer.

As a further optional additive, the coating compositions may further include a cross-linking agent but are typically free of such materials. The surfactants and other optional additives if used are typically present in the composition in minor amounts such as from 0.01 to 10 wt % based on total solids of the coating composition.

The coating compositions can be prepared following known procedures. For example, the compositions can be prepared by dissolving solid components of the composition in the solvent components. The desired total solids content of the coating compositions will depend on factors such as the desired final layer thickness. Preferably, the thickness of the coating composition is less than or equal to the thickness of the resist pattern, or not significantly greater than that of the resist pattern to minimize the amount of acid diffusion into the top surface of the resist pattern from an overburden layer. Preferably, the solids content of the coating compositions is from 0.1 to 10 wt %, more preferably from 1 to 5 wt %, based on the total weight of the composition.

Coating composition layer 110 is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning. A typical thickness for layer 110 is from 100 to 1500 Å.

As shown in FIG. 1D, the substrate is next baked to remove solvent in the composition layer, to allow for the free acid or thermally generated acid to diffuse into the sidewalls 112 of the first resist pattern and the polarity-changing reaction to occur in the resist sidewall region. The bake can be conducted with a hotplate or oven, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used.

In the case a photoacid generator is used in the coating composition, the composition layer 110 is exposed to activating radiation to generate the acid prior to the above-described bake. It is preferred in this case that the exposure be a patternwise exposure using the same photomask as used for the first exposure. In this way, acid generation in non-sidewall portions of the first resist pattern 104' can be prevented or minimized.

The photoresist pattern is next contacted with a negative tone developer to remove those portions of the first photoresist pattern 104' which have not been solubility-switched, leaving the solubility-switched sidewalls 112 which form the multiple-pattern, as shown in FIG. 1E. The developer is typically an organic developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate. The organic solvents are typically present in the developer in a combined amount of from 90 wt % to 100 wt %, more typically greater than 95 wt %, greater than 98 wt %, greater than 99 wt % or 100 wt %, based on the total weight of the developer.

The second developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove regions of the photoresist that have not been solubility-switched, with a time of from 5 to 30 seconds being typical. Development is typically conducted at room temperature.

With reference to FIG. 1F, the one or more layers to be etched are etched using the multiple-pattern 112 as an etch mask to form patterns 102'. Suitable etching techniques and chemistries for etching the underlying layers are known in the art. Dry-etching processes such as reactive ion etching are typical. The resist sidewall multiple-pattern 112 can next be removed from the substrate using known techniques, for example, oxygen plasma ashing. The resulting structure is a pattern of etched features 102', such as line/space, trench and/or contact hole patterns, as illustrated in FIG. 1G.

While the methods exemplified with respect to FIG. 1 make use of a positive tone developer as the first developer and a negative tone developer as the second developer, the methods of the invention are not limited to such a sequence. In accordance with a further aspect of the invention, the order of the positive tone developer and negative tone developer can be reversed, such that the negative tone developer is the first developer and the positive tone developer is the second developer. An exemplary process flow for a multiple-patterning method in accordance with the invention using this development sequence is illustrated in FIG. 2. The description with respect to FIG. 1 is generally applicable to this process with exception of the following. After exposure of the photoresist layer 104 as shown in FIG. 2A, unexposed regions of the photoresist layer 104 are removed by the negative tone developer as shown in FIG. 2B, leaving the exposed region forming the first resist pattern 104'. The sidewall portions of the first resist pattern 104' can be made insoluble in the positive tone developer to be applied, for example, by including a crosslinker in the coating composition. The crosslinker is infused into the sidewalls 112 of the first resist pattern 104' which become crosslinked during the coating composition bake as shown in FIG. 2D. Non-crosslinked portions of the first resist pattern 104' are removed by the positive tone developer, as shown in FIG. 2E, leaving the insoluble sidewall portions 112 forming the multiple-pattern.

FIG. 3 shows a multiple-patterning process flow in accordance with a further aspect of the invention. This process includes a pattern shrink process after formation of the resist multiple-pattern from the first resist pattern. The pattern shrink is accomplished by formation of a coating 114 over the multiple-pattern 112 as shown in FIG. 3F. Suitable pattern shrink techniques and materials are known in the art. As a result of the shrink coating, the spacing between adjacent patterns becomes reduced. This allows for the formation of features such as contact holes and trenches having very small dimensions that cannot readily be formed by direct patterning. While this process flow is exemplified using a first, positive tone development and second, negative tone development sequence as discussed with respect to FIG. 1, it can also be applied to the reverse sequence described with reference to FIG. 2.

The following non-limiting examples are illustrative of the invention.

EXAMPLES

Photoresist Composition Preparation
Photoresist Composition 1

25.4 g Polymer A solution (10%) in PGMEA, 15.95 g PAG A solution (2%) in methyl-2-hydroxyisobutyrate, 9.905 g PAG B solution (2%) in methyl-2-hydroxyisobutyrate, 4.96 g solution (1%) of tert-butyl (1,3-dihydroxy-2-(hydroxymethyl)propan-2-yl)carbamate in methyl-2-hydroxyisobutyrate, 0.414 g Additive A (23.2%) in PGMEA, 10.73 g PGMEA and 32.67 g methyl-2-hydroxyisobutyrate were mixed for 5 hours. The mixture was filtered with a 0.2 micron Nylon filter.

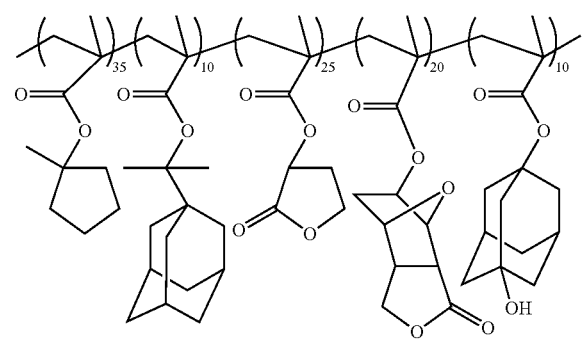

Polymer A

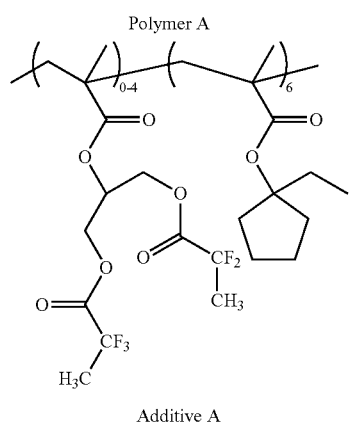

Additive A

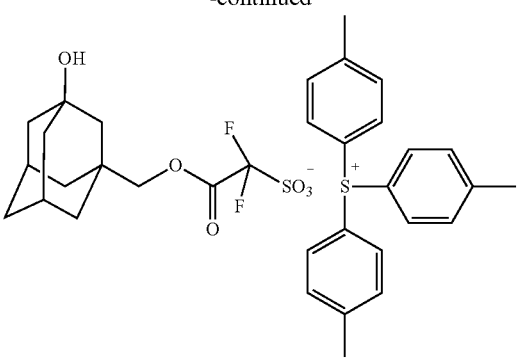

PAG A

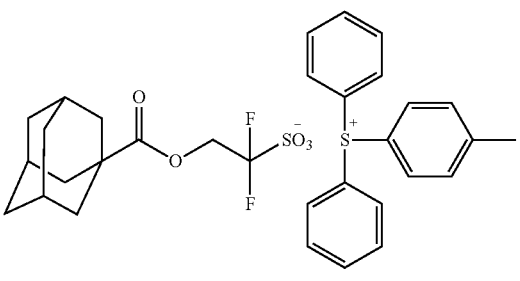

PAG B

Photoresist Composition 2

5.57 g Polymer B solution (10%) in PGMEA, 5.57 g Polymer C solution (10%) in PGMEA, 1.062 g PAG A solution (2%) in methyl-2-hydroxyisobutyrate, 8.232 g PAG C solution (2%) in methyl-2-hydroxyisobutyrate, 0.504 g solution (1%) of tert-butyl (1,3-dihydroxy-2-(hydroxymethyl)propan-2-yl)carbamate in methyl-2-hydroxyisobutyrate, 0.163 g Additive A (23.2%) in PGMEA, 24.41 g PGMEA and 54.491 g methyl-2-hydroxyisobutyrate were mixed for 5 hours. The mixture was filtered with a 0.2 micron Nylon filter.

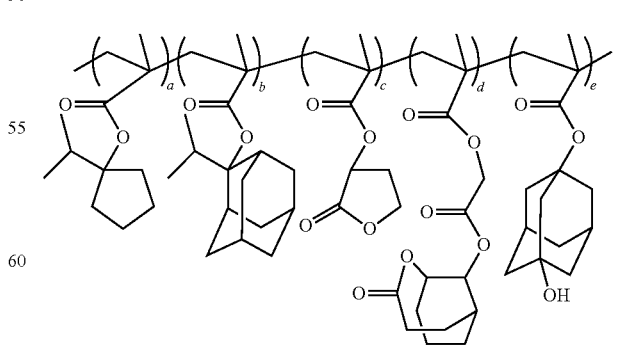

Polymer B
PAMA/IPCPMA/aGBLMA/X-GM-HL2/HAMA
(17.1/29.4/25.2/10.7/17.6)

-continued

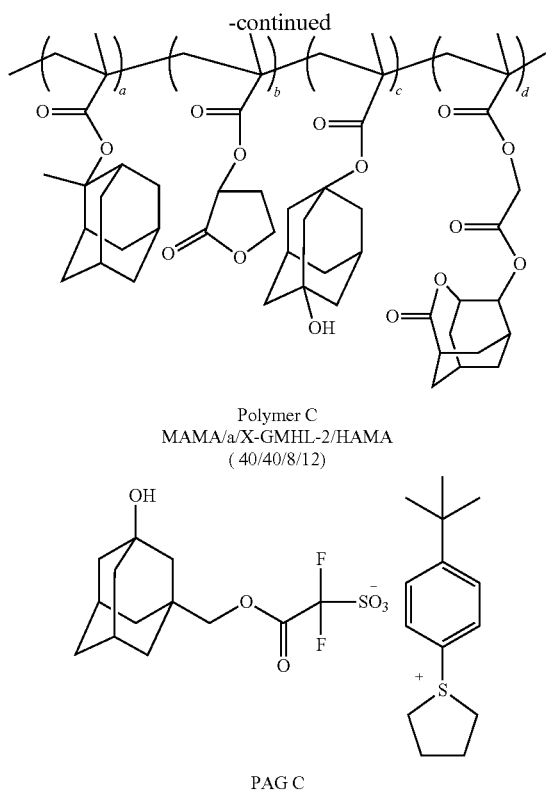

Polymer C
MAMA/a/X-GMHL-2/HAMA
(40/40/8/12)

PAG C

Resist Pattern Coating Composition Preparation
Resist Pattern Coating Composition 1

6.1081 g copolymer solution of n-butyl methacrylate/methacrylic acid (77/23 mole ratio) (23%) in methyl isobutyl carbinol, 2.16 g p-toluenesulfonic acid solution (1%) in methyl isobutyl carbinol, 72.663 g methyl isobutyl carbinol and 19.716 g isoamyl ether were mixed until all components dissolved. The mixture was filtered with a 0.2 micron Nylon filter.

Resist Pattern Coating Composition 2

6.1081 g copolymer solution of n-butyl methacrylate/methacrylic acid (77/23 mole ratio) (23%) in methyl isobutyl carbinol, 1.513 g p-toluenesulfonic acid solution (1%) in methyl isobutyl carbinol, 72.663 g methyl isobutyl carbinol and 19.716 g isoamyl ether were mixed until all components dissolved. The mixture was filtered with a 0.2 micron Nylon filter.

Lithographic Processing

Example 1

200 mm silicon wafers were spin-coated with AR™40A antireflectant (Dow Electronic Materials) to form a first bottom antireflective coating (BARC) on a TEL Lithius (Tokyo Electron) coating track. The wafers were baked for 60 seconds at 215° C., yielding a BARC film thickness of 800 Å. Photoresist Composition 1 (Dow Electronic Materials) was coated on the BARC-coated wafers and soft-baked at 90° C. for 60 seconds to provide a resist layer thickness of 600 Å. The wafers were exposed using an ASML PAS 5500/1100 scanner, 0.75 NA operating at 193 nm through a photomask with PSM feature size of 105 nm line/180 nm pitch Line/Space pattern, under dipole-35Y with outer/inner sigma of 0.89/0.64. The exposed wafers were post-exposure baked at 100° C. for 60 seconds and developed with TMAH developer (2.38 wt %) to form first resist patterns. CDs were determined by processing the image captured by top-down scanning electron microscopy (SEM) using a Hitachi 9380 CD-SEM, operating at an accelerating voltage of 800 volts (V), probe current of 8.0 picoamperes (pA), using 200 K× magnification. The results of the CD measurements were 129 nm for the linewidth.

The resist-patterns wafers were coated with Resist Pattern Coating Composition 1 on a TEL Lithius coating track, and baked at 70° C. for 60 seconds, to a thickness of 350 Å. The wafers were developed with n-butyl acetate to form multiple-patterns from the first resist patterns. CDs were determined by processing the image captured by top-down scanning electron microscopy (SEM) using a Hitachi 9380 CD-SEM, operating at an accelerating voltage of 800 volts (V), probe current of 8.0 picoamperes (pA), using 200 K× magnification. The results of the CD measurements were 45 nm for the multiple-pattern.

Example 2

300 mm silicon wafers were spin-coated with AR™40A antireflectant (Dow Electronic Materials) to form a first bottom antireflective coating (BARC) on a TEL Lithius (Tokyo Electron) coating track. The wafers were baked for 60 seconds at 215° C., yielding a BARC film thickness of 800 Å. Photoresist Composition 2 (Dow Electronic Materials) was coated on the BARC-coated wafers and soft-baked at 95° C. for 60 seconds to provide a resist layer thickness of 600 Å. The wafers were exposed using a Nikon S610c immersion scanner, 1.30 NA operating at 193 nm through a photomask with PSM feature size of 52 nm space/160 nm pitch Line/Space pattern, under dipole-35Y with outer/inner sigma of 0.98/0.78. The exposed wafers were post-exposure baked at 95° C. for 60 seconds and developed with TMAH developer (2.38 wt %) to form first resist patterns. CDs were determined by processing the image captured by top-down scanning electron microscopy (SEM) using a Hitachi CG4000 CD-SEM. The results of the CD measurements were 52.06 nm for the space. The resist-patterned wafers were coated with Resist Pattern Coating Composition 2 on a TEL Lithius coating track, and baked at 70° C. for 60 seconds, to a thickness of 360 Å and 460 Å. The wafers were developed with n-butyl acetate to form multiple-patterns from the first resist patterns.

What is claimed is:

1. A multiple-pattern forming method, comprising:
   (a) providing a semiconductor substrate comprising one or more layers to be patterned;
   (b) forming a photoresist layer over the one or more layers to be patterned, wherein the photoresist layer is formed from a composition comprising: a matrix polymer comprising an acid labile group; a photoacid generator; and a solvent;
   (c) patternwise exposing the photoresist layer to activating radiation;
   (d) baking the exposed photoresist layer;
   (e) contacting the baked photoresist layer with a first developer to form a first resist pattern;
   (f) treating the first resist pattern with a coating composition comprising an expedient for switching solubility of a sidewall region of the first resist pattern from soluble to insoluble with respect to a second developer that is different from the first developer, wherein the expedient comprises an acid or an acid generator chosen from thermal acid generators, photoacid generators, and combinations thereof, or a combination of any of the foregoing; and (g) contacting the treated first resist pattern with the second developer to remove portions of the first resist pattern, leaving the solubility-switched sidewall region to form a multiple-pattern.

2. The multiple-pattern forming method of claim 1, wherein the coating composition comprises a polymer which is soluble in the second developer.

3. The multiple-pattern forming method of claim 1, wherein the coating composition comprises an organic solvent.

4. The multiple-pattern forming method of claim 1, wherein the coating composition further comprises a surface active additive that migrates to an upper surface of a layer formed from the composition during the treatment of the first pattern with the coating composition.

5. The multiple-pattern forming method of claim 1, wherein the first developer is an aqueous alkaline developer and the second developer is an organic solvent developer.

6. The multiple-pattern forming method of claim 1, wherein the first developer is an organic solvent developer and the second developer is an aqueous alkaline developer.

7. The multiple-pattern forming method of claim 1, further comprising after forming the multiple-pattern, coating the multiple-pattern with a shrink composition comprising a polymer and a solvent to increase a width of the multiple-pattern, thereby reducing spacing in the multiple-pattern.

8. The multiple-pattern forming method of claim 7, wherein the polymer of the shrink composition comprises a group chosen from a nitrogen-containing group, epoxy, carboxylic acid, ester, alcohol, or a combination thereof.

9. The multiple-pattern forming method of claim 7, wherein the polymer of the shrink composition comprises a functional group that forms a bond with carboxylic acid groups present on a surface of the multiple-pattern.

10. The multiple-pattern forming method of claim 7, wherein the solvent of the shrink composition is an aqueous solvent or an organic solvent.

11. The multiple-pattern forming method of claim 1, wherein the expedient comprises an acid.

12. The multiple-pattern forming method of claim 1, wherein the expedient comprises a thermal acid generator.

13. The multiple-pattern forming method of claim 1, wherein the expedient comprises a photoacid generator.

* * * * *